Figure 1:
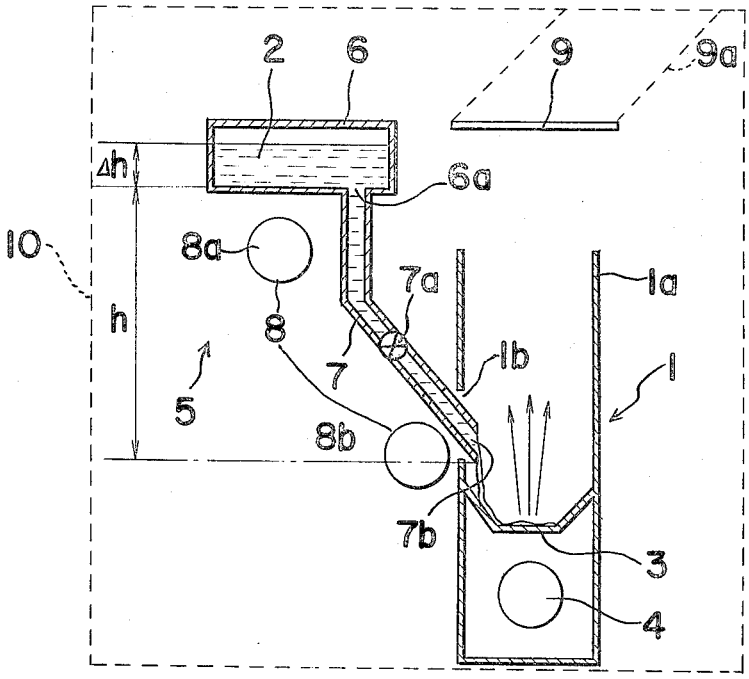
Figure 2:
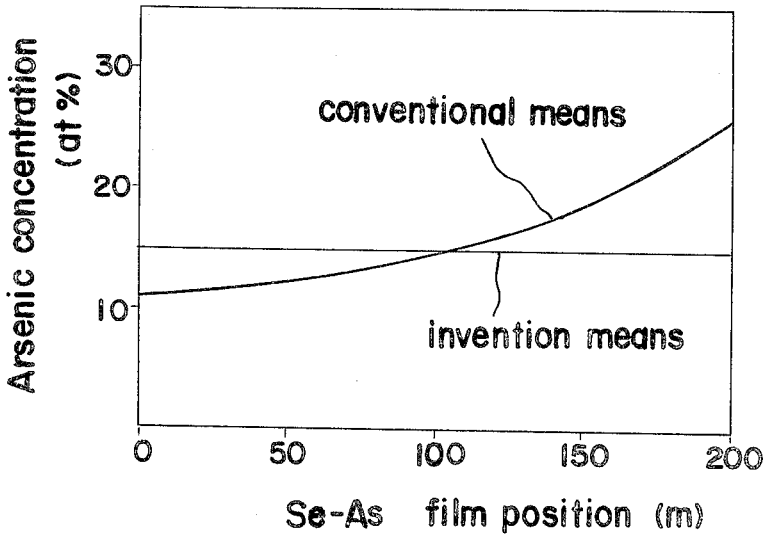
Figure 3:
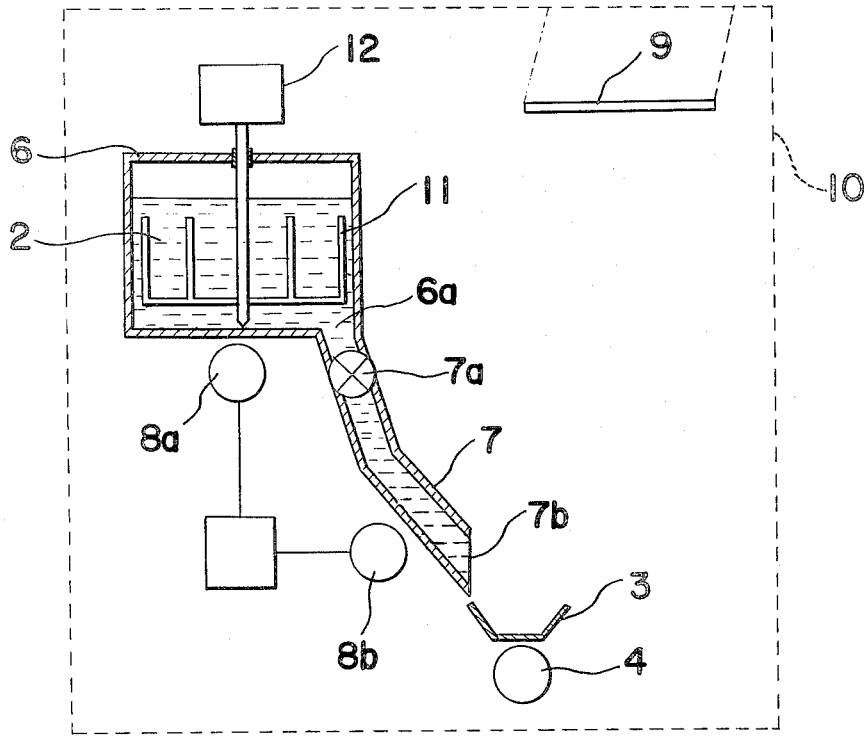
Figure 4:
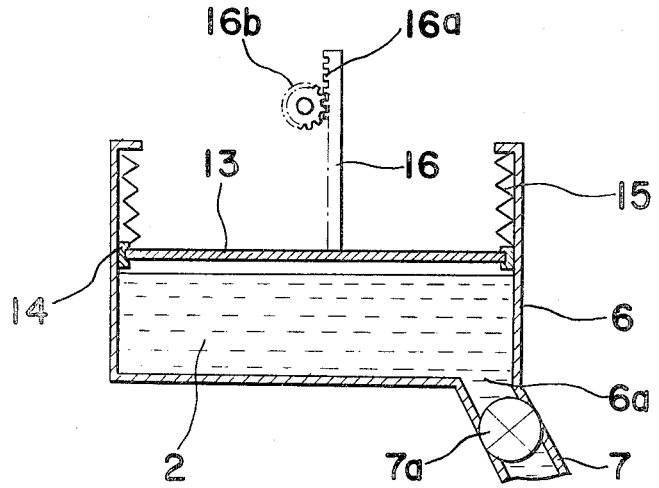

United States Defensive Publication [19] (H) [11] T988,002

Ohta [43] Nov. 6, 1979

[54] APPARATUS FOR FORMING A VACUUM EVAPORATING LAYER ON A SUBSTRATE

[75] Inventor: Kazuo Ohta, Nishinomiya, Japan

[73] Assignee: Minolta Camera Kabushiki Kaisha, Osaka, Japan

[21] Appl. No.: 931,441

[22] Filed: Aug. 7, 1978

Related U.S. Application Data

[63] Continuation-in-part of Ser. No. 821,929, Aug. 3, 1977, abandoned.

[51] Int. Cl.[2] ..... C23C 13/08

[52] U.S. Cl. ..... 118/719

[57] ABSTRACT

An evaporator element is positioned within a hermetic enclosure having therein a desired atmosphere. A supply receptacle containing a source material is located at a position higher than the evaporator element. A source material heater is positioned adjacent the supply receptacle for melting the source material. A duct is inclined from the supply receptacle to the evaporator element to substantially continuously supply molten source material from the supply receptacle to the evaporator element. An evaporation heater adjacent the evaporator element substantially momentarily evaporates the molten source material as it is supplied to the evaporator element, without any substantial accumulation of the molten source material in the evaporator element. A substrate is positioned so as to have deposited thereon a layer of source material evaporated from the evaporator element.

11 Claims, 3 Sheets Drawing,

26 Pages Specification

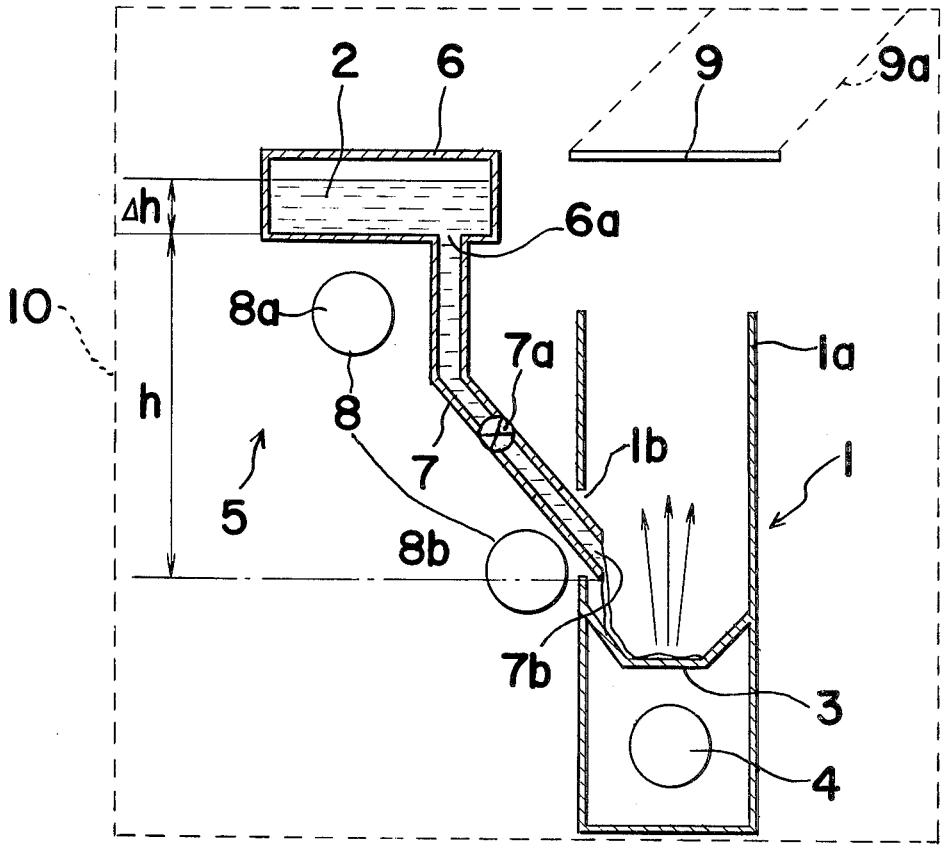

The file of this unexamined application may be inspected and copies thereof may be purchased (849 O.G. 1221, Apr. 9, 1968).